(12) United States Patent
Berkin

(10) Patent No.: US 6,168,064 B1
(45) Date of Patent: Jan. 2, 2001

(54) METHOD AND APPARATUS FOR CONTROLLING A TIME/TEMPERATURE PROFILE OF A REFLOW OVEN

(75) Inventor: George Michael Berkin, Yardley, PA (US)

(73) Assignee: Quad Systems Corporation, Willow Grove, PA (US)

(*) Notice: Under 35 U.S.C. 154(b), the term of this patent shall be extended for 0 days.

(21) Appl. No.: 09/212,746

(22) Filed: Dec. 16, 1998

Related U.S. Application Data

(62) Division of application No. 08/803,783, filed on Feb. 24, 1997, now Pat. No. 5,971,249.

(51) Int. Cl.[7] .................................................. B23K 3/04
(52) U.S. Cl. ............................. 228/9; 219/388; 219/398; 219/413; 432/37
(58) Field of Search ........................... 228/8, 9; 219/388, 219/395, 398, 412, 413, 449.1; 432/36, 37

(56) References Cited

U.S. PATENT DOCUMENTS 4,633,594 * 1/1987 Bovone .................................. 34/552

4,837,414 * 6/1989 Edamula ............................... 219/714

FOREIGN PATENT DOCUMENTS

410322015 * 12/1998 (JP) ...................................... 212/398

* cited by examiner

Primary Examiner—Samuel M. Heinrich
(74) Attorney, Agent, or Firm—John B. Sowell

(57) ABSTRACT

The present invention relates to controls for a multi-zone reflow oven. In the present invention a plurality of infra red thermal scanners are located at critical points along the path which a substrate passes in a reflow oven so as to generate an actual solder paste time/temperature profile as a substrate passes through the zones of the reflow oven. The actual temperature of the solder paste is determined at critical zones for generating feedback control signals. The time/temperature profile is stored for transfer to a different reflow oven so as to effect the identical solder paste time/temperature curve on the same or a different oven. Temperature deviations from the points on the solder paste time/temperature curve are calculated and control signals are generated for producing feedback signals that are applied to the controllers of the belt drive motor, the convection fan motors as well as the heating elements in the heating blocks of the vertical zone heaters to control and effect an actual and desired optimum solder paste time/temperature profile.

19 Claims, 9 Drawing Sheets

METHOD AND APPARATUS FOR CONTROLLING A TIME/TEMPERATURE PROFILE OF A REFLOW OVEN

This is a divisional of application Ser. No. 08/803,783 filed on Feb. 24, 1997, now U.S. Pat. No. 5,971,249.

BACKGROUND OF THE INVENTION

1. Field of the Invention

The present invention relates to an improved temperature control system for existing reflow ovens of the type used to make solder connection between surface mounted components that are positioned on a substrate. More particularly, the present invention relates to modification of controls on such reflow ovens which may be incorporated into some existing reflow ovens as well as being fitted into new ovens.

2. Description of the Prior Art

Presently, there are a large number of manufacturers of reflow ovens. The best and latest available reflow ovens, such as the Quad Profile Models designated High Thruput (HTP) have a plurality of heating zones. Each vertical zone is provided with an upper and a lower independent heating element juxtaposed each other through which passes a moving belt adapted to carry or move component populated substrates through the ovens and make solder connection of the components to the substrate, typically a printed circuit board, plastic or ceramic carrier.

When the components to be connected to the substrate are provided with leads or fingers they are inserted into vias in the substrate and may be soldered to the substrate using wave solder technique. However, when the components are to be connected using surface mounting technology (SMT), the components are not provided with leads or fingers, but are accurately placed on a conductive pattern on the substrate which has solder paste applied to pads where the electrodes, bumps or lead out terminals of the components are to be connected to the substrate.

One purpose of the reflow oven is to preheat the components and solder paste to a temperature that activates the flux in the solder paste preparing all connections for a condition that enhances making of solder connections. This stage is called preflow since it occurs prior to liquification of the micro miniature solder particles in the solder paste. If the time is too long or too short the optimum condition is not obtained. The temperature in the preflow zones is usually specified within a ±temperature range which is presently controlled by heater threshold setting and maintainable by on-off controllers.

Another purpose of the reflow oven is to heat the components and solder paste after being preheated to reflow temperature to effect melting and liquification of the solder particles remaining after the flux is driven off in the preheat stage. This stage is the most critical stage in a reflow oven in that the oven must have enough capacity to raise the temperature of the solder particles to a liquid state for a short predetermined critical time that may vary from a few seconds up to over one minute. The time-temperature in the reflow stage is dependent on the specification of the solder paste. There are a large number of manufacturers of a solder paste each of which sell a larger number of solder paste, each designed to produce an optimum condition for different devices and metallizations. If the temperature is raised too high, the components and the solder connection can be affected. If the time in the liquification state is too short, the quality of the solder connection is affected. If the time of liquification is too long, the lead/tin alloy begins to decompose.

So many factors are to be considered when designing a solder paste temperature profile that users of such paste have very little leeway other than to follow the advice of the paste manufacturer or obtain a second opinion which produces more desirable results.

Oven operators first set a belt speed and a manually set desired temperatures for the heat blocks according to empirical data and the solder paste manufacturers requirements. Once the heat blocks in the oven stabilize with the preselected threshold temperature, the substrate may be run only if the data previously accumulated contains information on the same solder paste previously run for an identical part or parts. However, the prior art reflow ovens have no way of determining if the oven or the solder paste has changed or will actually perform the same as previously.

It would be desirable to provide a method and apparatus for determining the solder paste temperature of a production component populated substrate during production in order to control a time/temperature profile which is related to obtaining optimum solder connections and yields.

SUMMARY OF THE INVENTION

It is a principal object of the present invention to provide temperature sensors placed outside of the reflow oven which are capable of measuring the solder paste temperature of solder on the surface of a substrate passing through a reflow oven.

It is a principal object of the present invention to provide an infra red sensing device outside of a reflow oven optically adapted to view portions of a substrate passing through a reflow oven.

It is another object of the present invention to measure actual temperatures of solder paste on a component populated substrate while the substrate is moving through a reflow oven.

It is another object of the present invention to provide a measured solder paste temperature on a substrate just prior to and/or during a reflow operation.

It is another object of the present invention to measure a temperature or temperatures of solder paste on a substrate and to compare the temperature or temperatures to a known reference in order to produce feedback control signals capable of controlling the temperature profile during production.

According to these and other objects of the present invention, a multi-zone reflow oven has been modified by adding infra red thermal scanners at points along and/or between plural zones. The actual temperature of the solder paste is determined preferably at and during reflow so that the actual temperature can be compared with desired temperatures on a solder paste time/temperature curve. Temperature deviations are calculated and control signals are generated for producing feedback signals to the belt drive motor, the fan convection motors, and the heating elements imbedded in the heat blocks of the vertical zone heaters to control an effect and actual desired solder paste time/temperature profile.

BRIEF DESCRIPTION OP THE DRAWINGS

DESCRIPTION OF THE PREFERRED EMBODIMENT

Figure 1:
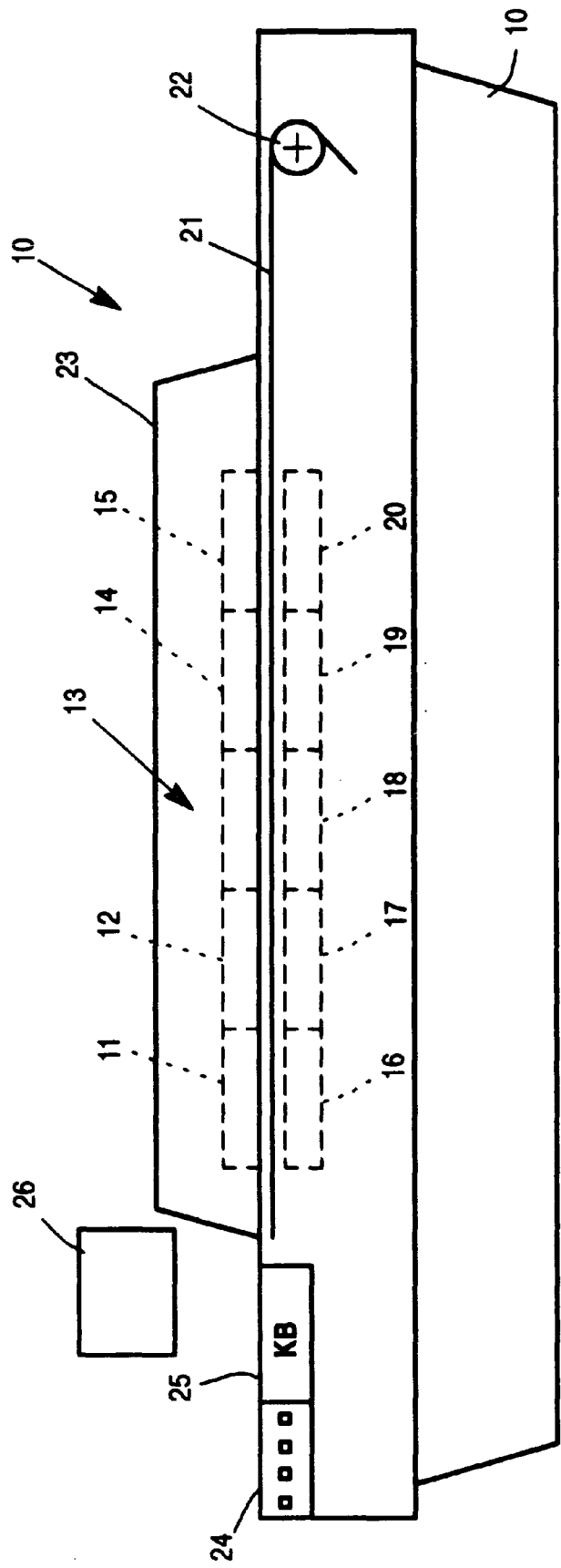
FIG. 1 is a side view of a prior art reflow oven showing the location of the monitor and control panels.

Refer now to FIG. 1 showing a side view of a prior art reflow oven 10 having five vertical heating zones defined by top heaters or heat blocks 11 to 15 which are juxtaposed the bottom heaters 16 to 20. The belt 21 is driven by a motor generally shown at 22 having a drive sprocket. An idler sprocket is shown at the other end of the oven Prior Art ovens such as the Quad Profile series embody the latest available technology but have no means for automatically setting and automatically feeding back temperature control signals as will be explained in greater detail hereinafter.

Figure 2:
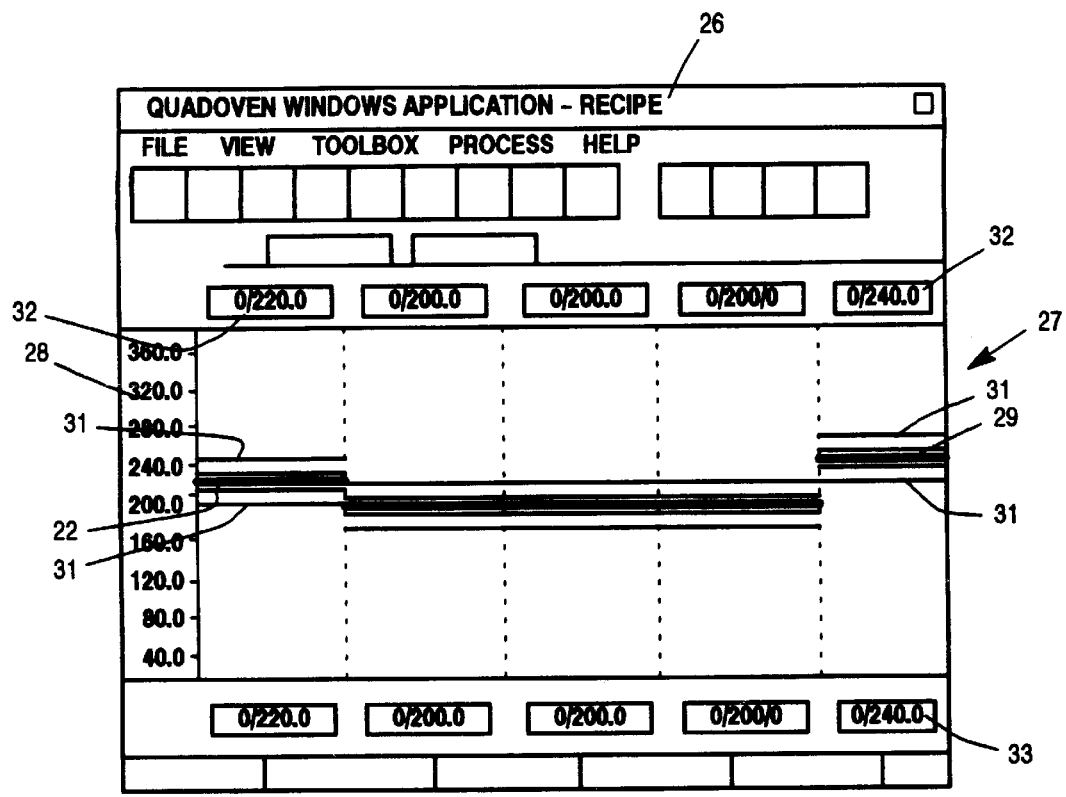
FIG. 2 is a schematic drawing of a prior art monitor display used to set desired air convection temperatures in the individual heaters of the reflow oven.

Refer to FIG. 2 showing a schematic drawing of a prior art display of the type used in a FIG. 1 reflow oven. The display 27 is a typical bar temperature screen of the type that is generated using a Windows 95 operating system having graphic interface menu selections which permit the operator to set the convection temperature of the air passing through the heaters indicated at colorbars 29 and scale 28. On either side of the colorbar 29 there are deviation set points or bars which are usually set plus or minus five degrees C from the wanted or desired temperature 29. The wanted or desired temperature (W) for each of the ten heaters in the five zones may be set individually at the keyboard 25 and are shown at bars 31. Boxes 32 and 33 above and below bars 29 and 31 show an actual temperature (A) followed by a slash and the wanted (W) or desired temperature thereafter. For example, in zone five the bottom heater is showing 240° C. and is set at 240° C. The colorbar 29 and the fifth zone is approximately at 240° as shown on the temperature scale 28. The display 27 permits the operator to set desired temperatures for bottom and top heaters 11 through 20 and to observe the colorbars 29 as the rise in temperature and settle between the deviation points or set points 31. After the oven is stabilized with they desired temperatures in the different zones, production substrates may be placed in the oven only if the zone settings are known to produce a desired result. However, if the settings on the display of FIG. 2 have never been tested, it is proper to run a test substrate through the reflow oven to determine whether or not the settings will achieve a desired temperature for the solder paste which holds the components to the substrate and are to be reflowed or permanently connected to the substrate by passing them through the reflow oven.

Figure 3:
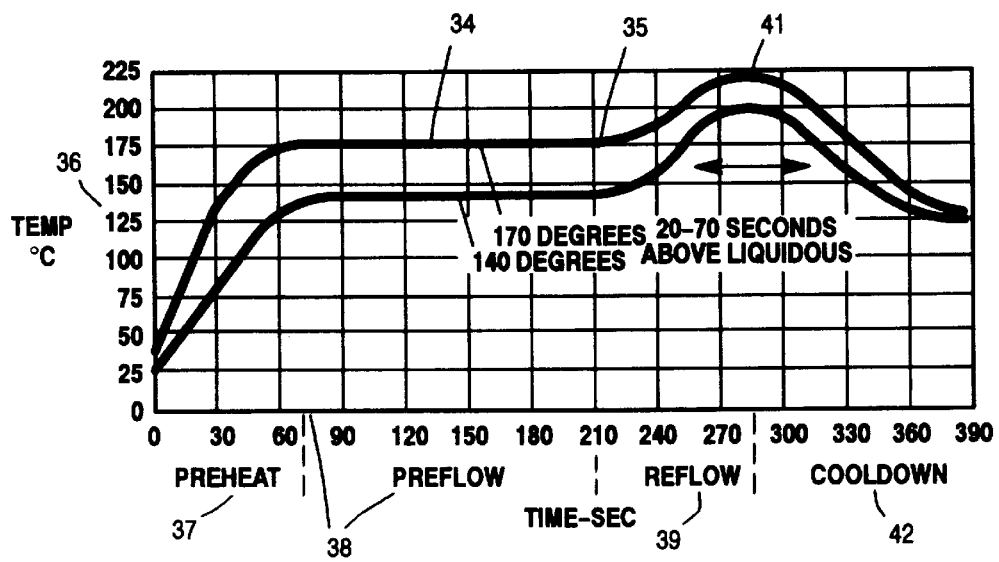
FIG. 3 is a schematic drawing depicting the theoretical temperature thresholds to be encountered by a component populated substrate passing through a prior art reflow oven with long wire thermocouples embedded in the substrate.

Refer now to FIG. 3 showing a schematic drawing depicting the theoretical temperature thresholds 31 as they would appear if they could be measured when a component populated substrate is passed through the reflow oven. In actual practice, the two curves 34 and 35, if they existed, would embrace the temperature of the solder paste on the substrate if it could be measured by the prior art devices. There is shown a temperature scale 36 indicating that waveform or curve 34 rises to approximately 175° C. in the preheat zone 37, and maintains this temperature as it passes through two preflow zones 38. After the component populated substrate is stabilized in the preflow zones 38, it passes into a reflow portion of the oven which is hotter and raises the temperature in the reflow zone 39 to approximately 223° at point 41, where the substrate is leaving the reflow zone 39. As the substrate leaves the reflow zone 39 it passes into a cool down zone 42 where ambient air is passed over the substrate and cools the substrate and its soldered joints making a permanent connection. In summary, the two waveforms 34 and 35 do not actually exist, but show the heat range in which the solder paste temperature is attempted to be controlled. For example, in the preheat zone 37 the solder paste is merely heated. In the preflow zone 38, the solder paste is activated and is caused to clean the contacts between the components and the substrate prior to reflow. In the reflow zone 39, the solder paste temperature is driven above its liquid or molten state for a critical and predetermined time period, usually falling between 20 and 70 seconds, depending on the specifications of the solder paste manufacturer. It is known that if the liquid condition and elevated temperature conditions extends too long above the recommended temperature, the molten solder comprising a mixture of 63 percent tin and 37 percent lead will deteriorate and become disassociated as an alloy which increases its resistance characteristics. At the end of reflow cycle, all of the flux in the solder paste is completely driven off in the form of a vapor leaving only the desired solder connection.

Figure 4:
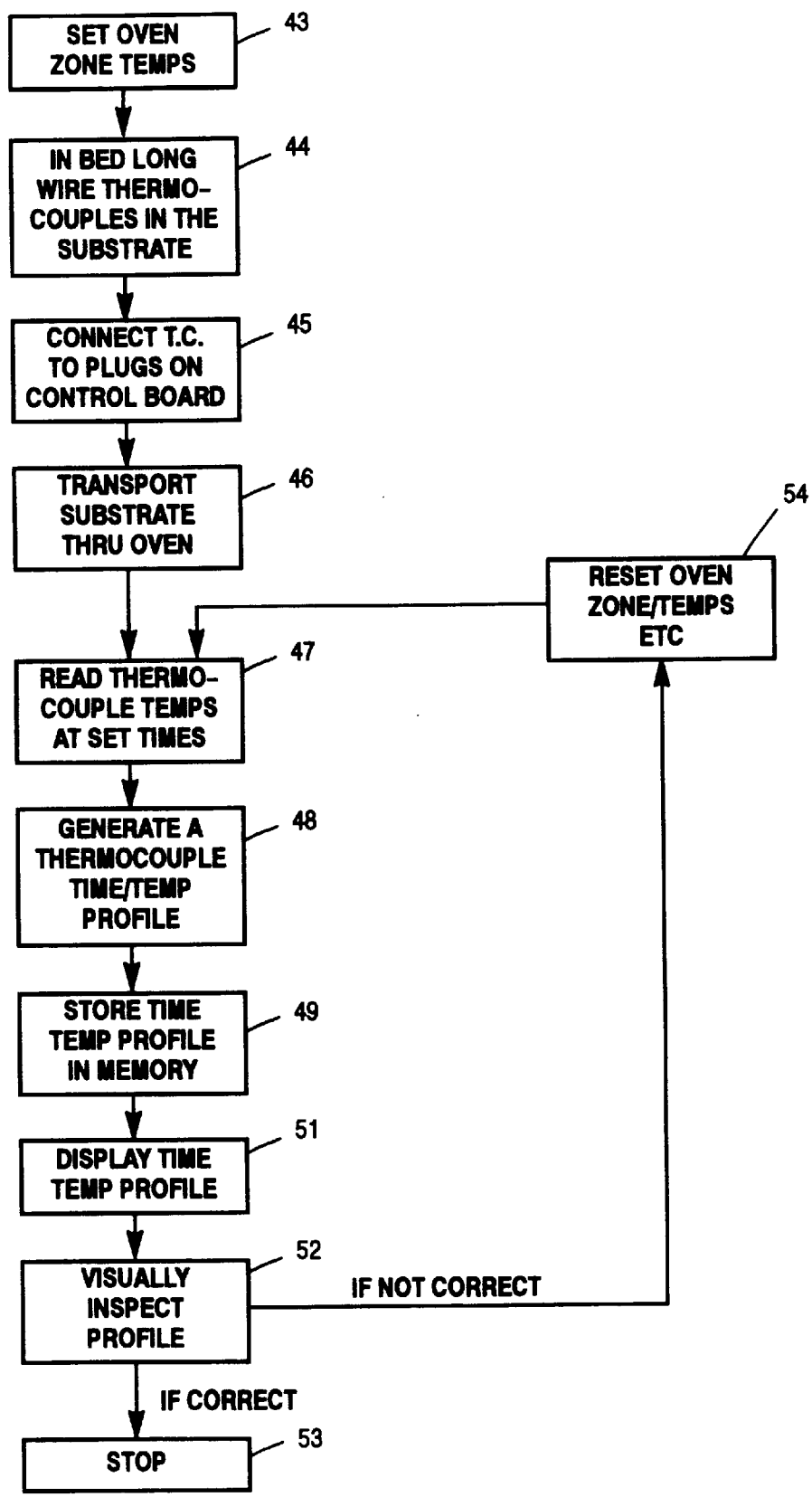
FIG. 4 is a block diagram of the steps employed to generate an actual thermocouple temperature profile of the type which may be superimposed on FIG. 3.

Refer now to FIG. 4 showing a block diagram of steps that are employed to generate actual thermocouple temperature profiles of the type that are shown in FIG. 3. If a substrate of the type which is to be soldered in the reflow oven 10 is wired with thermocouples, it is possible to pass the model through the reflow oven and obtain a profile which approximates the temperature of the solder paste. The oven zone temperatures are set at block 43. The embedded long wire thermocouples are embedded in the substrate at block 44. The long wire thermocouples are connected to the control board 24 at block 45 and the substrate is passed through the oven 10 as shown at block 46. The thermocouple temperatures may be continuously monitored and recorded in the central controller (not shown). A thermocouple time/temperature profile is shown generated at block 48. The stored time/temperature profile may be kept in the memory of the central controller as shown at block 49, and displayed on the display 26 as shown at block 51. If the visually inspected profile shown at block 52 is not within the set limits of the estimated or theoretical waveforms 34 and 35, then manual correction must be made as shown at block 54, then the oven temperatures or zone temperatures must be reset along with other conditions and a new set of readings must be obtained starting at block 47 and ending at block 52. Once the thermocouple temperature profile is deemed to be visually acceptable, the process of setting the oven may stop as shown at block 53. As will explained hereinafter, this manual procedure is very time consuming and does not offer a system or controls for repeating the identical profile using an identical substrate and identical solder paste on an identical oven at a future time. The manual system now employed would be much improved if an actual solder profile could be generated and the actual solder profile recorded in a manner which would allow it to be programmed in the same oven at a future date, or used in a different oven to run the same component populated substrate. Further, it is now possible using the present invention to program a desired solder paste profile into a central controller.

Figure 5:
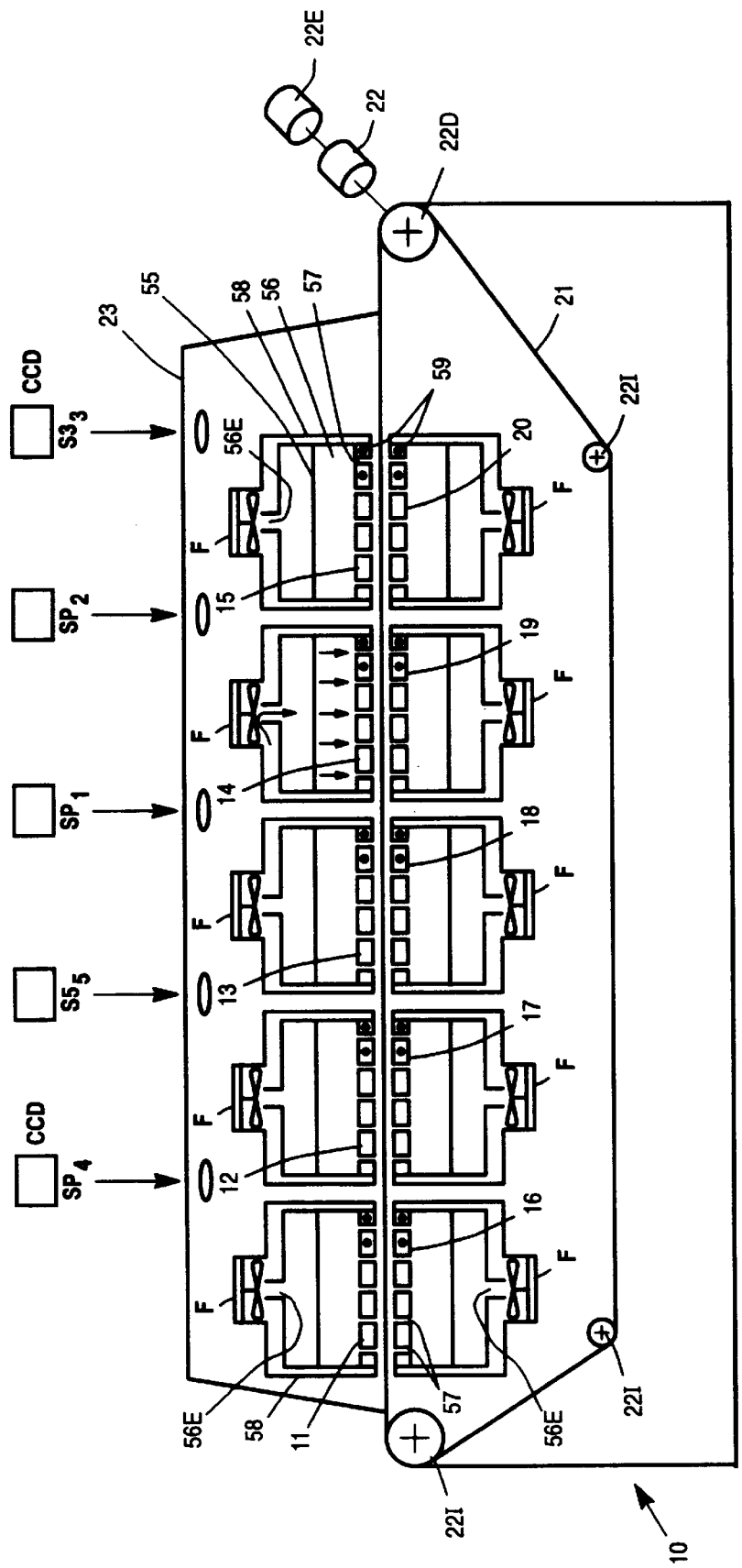
FIG. 5 is a schematic drawing in elevation of the present invention reflow oven showing a preferred location of infra red sensor positions between the last preflow zone and the critical reflow zone for scanning and determining solder paste temperatures to be controlled and to change the time/temperature profile during reflow.

Refer now to FIG. 5 showing a schematic drawing in elevation of the present invention reflow oven showing a preferred location of the infra red sensor positions at arrows $SP_1$ through $SP_5$ which will be explained in greater detail hereinafter. It is to be understood that the data obtained by the sensors $SP_1$ through $SP_5$ will be used to determine the temperature of the solder on the substrate. The actual sensors cannot be placed down in the oven without damaging the sensitive charge couple devices (CCDs) of the type usually used in infra red sensors cameras. Thus, it is necessary to locate the infra red sensor outside of the cover 23 and to project the line of sight between the zones of the heaters as shown at the position $SP_1$ through $SP_5$. As explained hereinbefore a belt drive motor 22 is employed to drive the belt 21. In the preferred embodiment of the present invention an encoder 22E is coupled to the drive motor and the drive sprocket 22D couples to the chain belt 21 which extends as a closed loop over idler sprockets 22I and the drive sprocket 22D. All the aforementioned heaters or heating blocks, 11 through 20 are shown having a plenum 56 on the back of the heaters which has a perforated separator 55 therein so that the air recirculated by the fans F is stabilized and creates a constant pressure in the plenum 56. The air passes uniformly through plural apertures 57 of the heater blocks 11 to 20 having Calrod heating elements 59 that are presently controlled in the prior art ovens by on/off switches. In the preferred embodiment of the present invention heaters are controlled by continuous controls such as SCRs or silicon control rectifiers (not shown). As will be explained in greater detail hereinafter, the present invention system can control the belt speed of belt 21 and the convection temperature of the air passing through the heaters or heat blocks which is indicated as a convection air temperature by thermocouples embedded or placed in the apertures of passageways 57.

Heated air passing through apertures 57 engages the component populated substrates 116 supported on moving belt 21 which may be an open mesh or a plurality of support bars. The heated convection air is captured in return ducts 58 which surround the plenum 56 and is pulled into the intake of fans F. The fans F expel the recirculating hot air into the neck or entrance 56E of plenum 56. The heating zones are maintained and operated as in a manner that has little or no effect on adjacent zones.

In the present invention, the preferred embodiment fans F each have individual speed controls which permit the air speed through the apertures 57 to be controlled almost instantaneously so as to obtain rapid heat changes which cannot be changed or controlled rapidly by controlling the power or energy to the heating elements 59. Before explaining the preferred embodiment controls, one of the desired features of the present invention is to minimize the time the substrate passes through the reflow zone and to accurately optimize the time and temperature that the substrate maintains in the reflow zone, so that the solder connections obtained by the feedback control result in optimum electrical connections with a maximum of throughput and a perfect yield.

Figure 6:
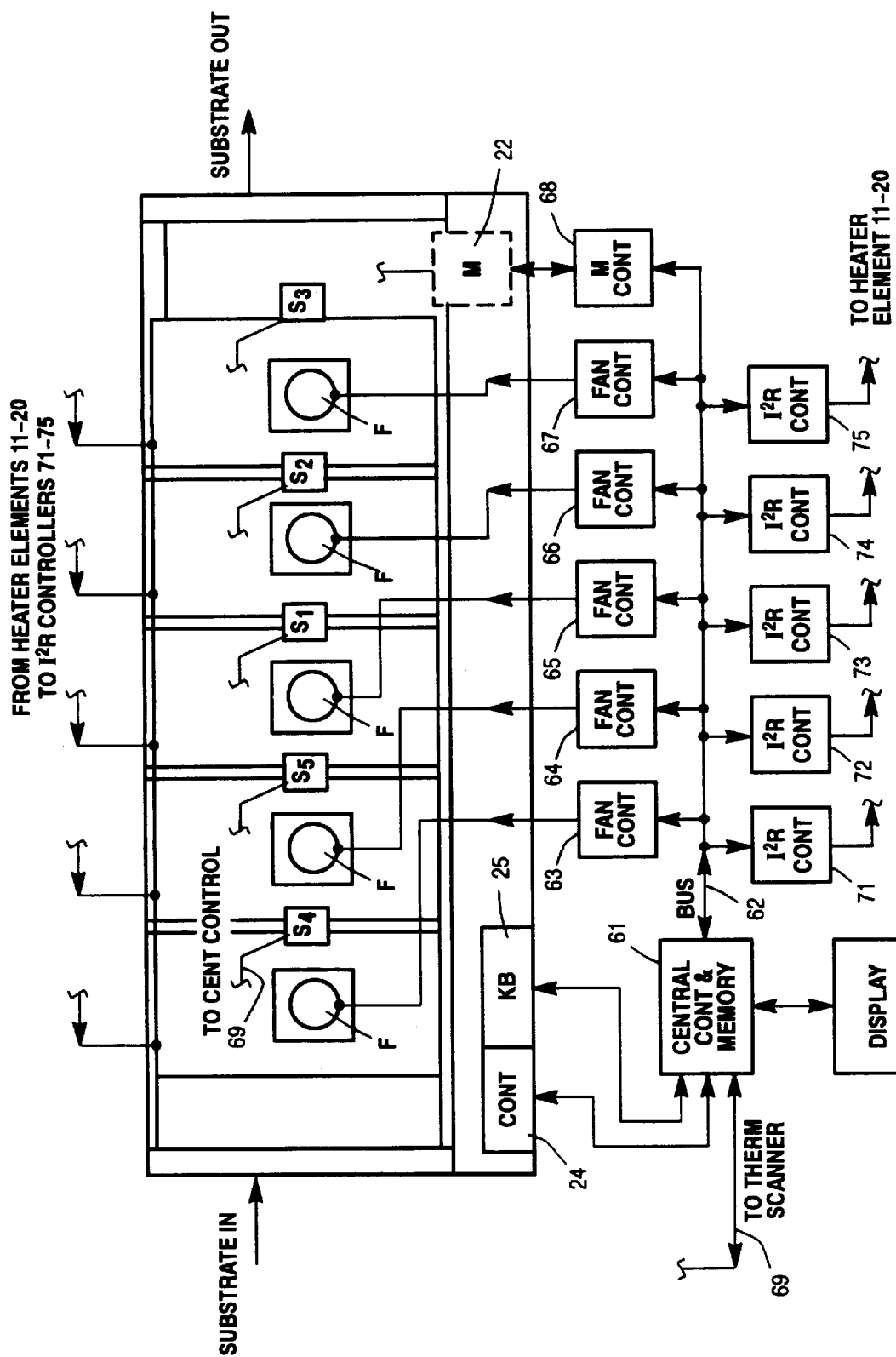
FIG. 6 is a schematic block diagram showing a five zone reflow oven in plan view and a preferred central controller connected to individual controls for fan motors, block heaters, the belt drive motor and infra red scanners; scanner positions are shown.

Refer now to FIG. 6 showing a schematic block diagram of the five zone reflow oven shown in FIG. 5 in plan view and showing a preferred embodiment central controller 61 connected to individual controls for the fan motors, block heaters and the belt drive motor and having infra red sensor scanner inputs as will now be explained. It is possible to employ a prior art central control of the type used in the FIG. 1 reflow oven when sufficient memory is supplied to implement the control operations which will now be explained. The central controller 61 is shown having a control bus 62 which connects individually to the fan controllers 63 through 67 used for controlling the fans F individually. Such fan controllers are commercially available as microchips and may be used to control DC motors F. The control bus 62 also connects to a motor controller 68 which is a commercially available motor controller for a DC motor 22. The same control bus 62 is shown connected to power controllers or $I^2R$ controllers 71 through 75 which individually connect to the heaters 59 in elements 11 through 20 which are usually the aforementioned Calrod elements 59. The $I^2R$ controllers are commercially available in different forms but silicon control rectifiers are a preferred controller for AC power devices. Each of the infra red scanners S1 through S5 are shown positioned over the gap between the heater zones. Control lines 69 form a bus 69 that connects to the central controller and memory 61. The central controller and memory is already connected to the keyboard 25 and the control panel 24, as well as the display 26 in the presently commercially available Quad Profile Series Reflow Ovens. It will now be appreciated that by adding individual controllers 63 through 68 and 71 through 75 to the prior art reflow oven, that optimum control and production may be achieved at a minimum of cost.

Figure 7:
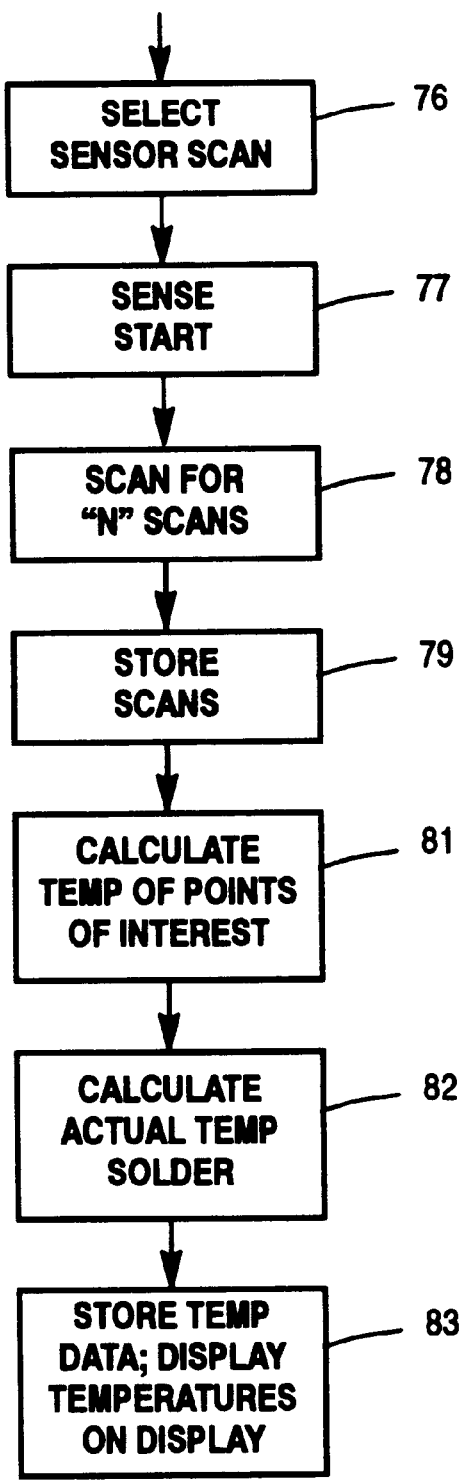
FIG. 7 is a block diagram of steps employed to generate infra red signals used to determine temperature at selected points on a solder paste curve in a zone of interest on a populated printed circuit board or substrate while moving through the reflow oven.

Refer now to FIG. 7 showing a block diagram of the generalized steps employed to generate infra red signals used to determine the temperature at selected points on a solder paste curve in a zone of interest on a populated printed circuit board or substrate while it is moving through the reflow oven shown in FIG. 6. Individual sensors S1 through S5 are selected and scanned so that the actual temperature on a substrate may be obtained and stored in the memory of the central controller 61. After the scanner is selected at block 76, the presence of the substrate under the scanner is sensed at block 77 and it is scanned for N number of scans to determine the information on the substrate in block 78. The plural scans are stored as shown by the step at block 79, and once stored the information may be used to calculate the temperature of points of interest on the substrate as shown at block 81. After calculating points of interest, it is also possible to calculate the actual temperatures of the solder or solder paste at the point of interest as shown at block 82 and the stored temperatures so calculated may be employed as data and stored in the memory of the central controller and displayed as temperatures on the display 26 as shown at block 83.

High definition thermal cameras and systems are available from AGEMA Infra Red Systems having offices in Secaucus, N.J. Such systems are sold as Thermal-vision 900 series systems which may be adapted to obtain narrow band scans between heaters as shown on FIG. 6. Further, such infra red systems as are used in infra red imagery are described in the proceedings of the SPIE, Volume 339, May 1982, and other systems are described in US Class 382 Subclasses 1 and 2. It will be appreciated that the systems described in these aforementioned articles are capable of obtaining images of the substrate by scanning portions of the substrate as it passes under the scanner and that the thermal images captured may be examined and is calibrated so that actual temperatures have an accuracy to one or two degrees C.

Figure 8:
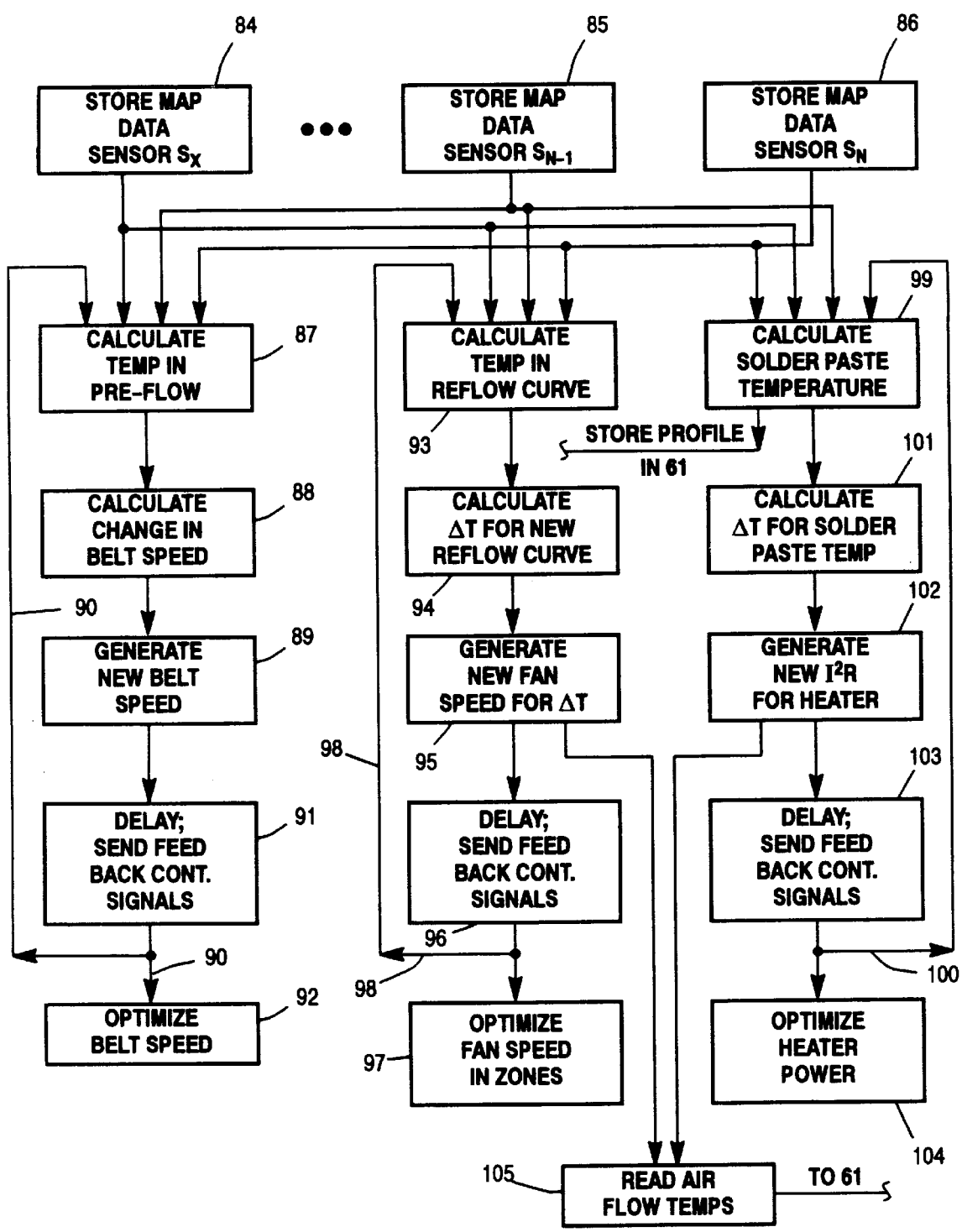
FIG. 8 is a block diagram showing the steps employed in generating control signals used to control belt speed, convection fan speed and heater block temperatures.

Refer now to FIG. 8 showing a block diagram of the steps employed in generating control signals that are used to control the belt 21 speed, the convection fan F speed, as well as the heater blocks 11 through 20 temperatures by controlling the power $I^2R$, applied to the Calrod elements 59 described in FIGS. 5 and 6. In the preferred embodiment of the present invention it is only necessary to have infra red sensors for determining the temperatures on either side of the preflow zone, the reflow zone, and at the cool down zone. The data stored in block 84 is obtained from the memory in central controller 61 which is associated with the scanner or scanners means used to calculate preflow temperatures. The solder paste temperature is calculated in block 87 for the preflow condition. Once the temperature is calculated it is now possible to determine if the belt speed may be increased as shown at block 88. If the belt speed is to be increased or decreased, a new belt speed signal is generated at block 89 and a delay is imposed before sending out a feedback signal as shown at block 91. Once the feedback signal is generated which is indicative of the change in the belt speed, it is now possible to determine if this new belt speed is going to change the temperature to the desired condition as shown on line 90, or whether the belt is optimized as shown at block 92.

The data associated the scanner means used to calculate the reflow temperature curve are supplied to block 93 to enable block 93 to calculate the temperatures on the reflow curve. Once the data is accumulated for the reflow curve it is now possible to calculate the change in temperature or ΔT needed for a new reflow curve as shown at block 94. As explained hereinbefore, the time that the solder paste is liquified is a critical time and if the time needs to be increased the reflow temperature can be increased to broaden the base of the reflow curve and increase the time of the molten condition. Likewise it possible to decrease the maximum temperature of the reflow curve so as to decrease the time of molten condition. Since this condition must be changed independent of the belt speed, it is preferred that the temperature change be made by generating new fan speeds for a change of ΔT as shown at block 95. The new fan speed for the desired ΔT is passed to block 96 where a delay is imposed. The feedback signals can optimize the fan speeds in the different zones as shown at block 97 or a signal generated on line 98 which is fed back to block 93 so as to calculate the new heater temperatures. One of the features of the present invention is the ability to determine the necessary solder paste temperatures for each of the zones. For example the data stored in the memory 61 for each of the sensors $S_X$ through $S_N$ may be employed to calculate a solder paste temperature profile curve as shown at block 99. The profile may be stored and used in any reflow oven to adjust the zones for time and temperature as well as the time and temperature of the total curve, as well as selected zones. It is also possible to use this information to calculate a desired convection air temperature for controlling that condition of the solder paste as shown at block 101. This information is now employed in block 102 to generate a feedback signal for controlling the heaters as shown at block 102. The generated signal at block 102 is delayed and sent as a feedback signal at block 103 to the heater controllers 71 through 75 until an optimized heater power condition is reached as shown at block 104. In the preferred embodiment of the present invention when the fan speeds are changed to effect a change in convection air temperature and/or the heaters are controlled by the amount of power supplied, the air flow temperatures of the thermocouples in the heater blocks is affected by the changes. Either type of information supplied is supplied to block 105 so as to determine the amount of temperature change affected by either power and fan speed independent of each other.

Figure 9:
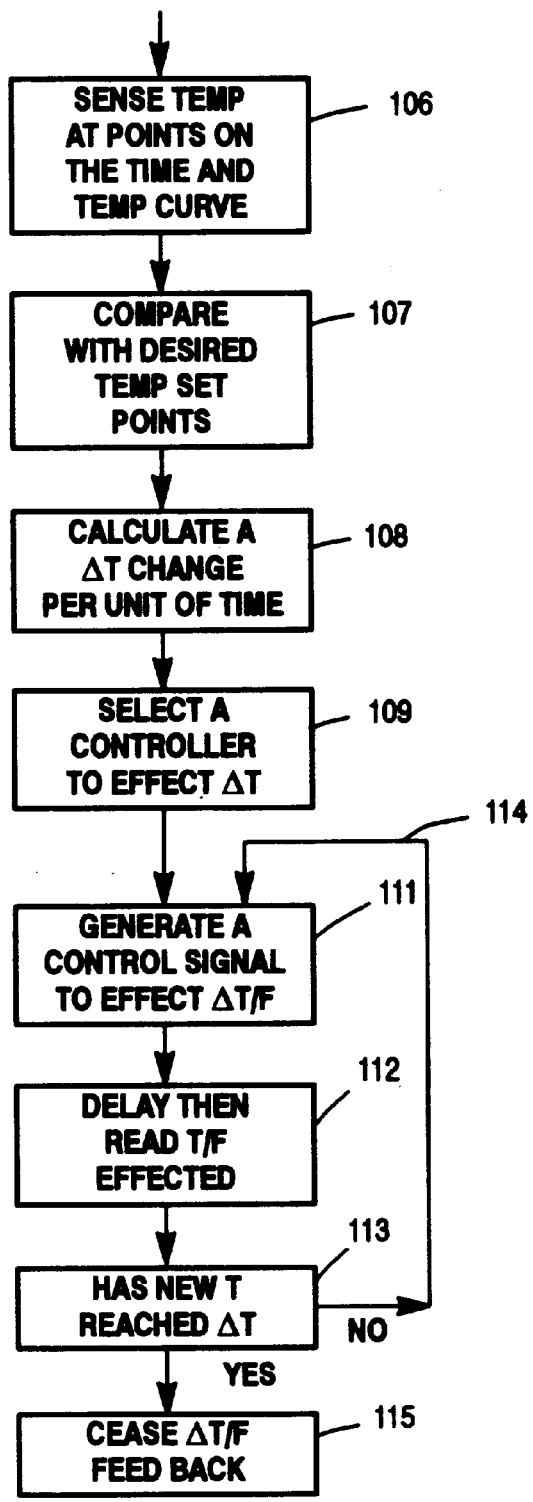
FIG. 9 is a block diagram showing in greater detail the steps employed to effect temperature changes by generating fractional control signals.

Refer now to FIG. 9 showing a more specific block diagram in greater detail having the steps employed to effect temperature changes by generating fractional control signals. Once the temperature at different points on the solder paste time and temperature curve are sensed at block 106, they may be compared with a solder paste temperature curve stored in memory or with desired temperature set points set in the keyboard and generated as a profile on the display 26 as shown at block 107. Once a solder paste profile is stored in memory, it is now possible to calculate a solder paste temperature change ΔT per unit of time as shown at block 108 to effect the temperature change. It is possible to select a controller or controllers to effect that temperature change as shown at block 109. Control signals are generated at block 111 to effect a partial ΔT/F change. Having sent the control signal to the controller to effect a fractional temperature change, it is possible to monitor the change obtained by delaying then reading the temperature on the solder paste temperature curve as shown at block 112. The effect of the signal generated at block 111 is determined by taking the reading at block 112. It is now possible to project future temperature changes and to determine whether the new temperature T has been reached or whether additional fractional control signals are needed for the temperature change as shown at block 113. If the desired temperature has not yet occurred, the feedback line 114 repeats the fractional temperature control signal operation as shown at block 111 until the desired temperature condition at block 112 and the feedback signals which effect the fractional ΔT feedback signals are ceased as shown at block 115.

Having explained how preferred temperature and incremental feedback signals are employed, it will be understood that the same type of signal is generated for controlling the speed of the fans in the individual zones as well as controlling the motor 22 which controls the speed of belt 21.

Figure 10:
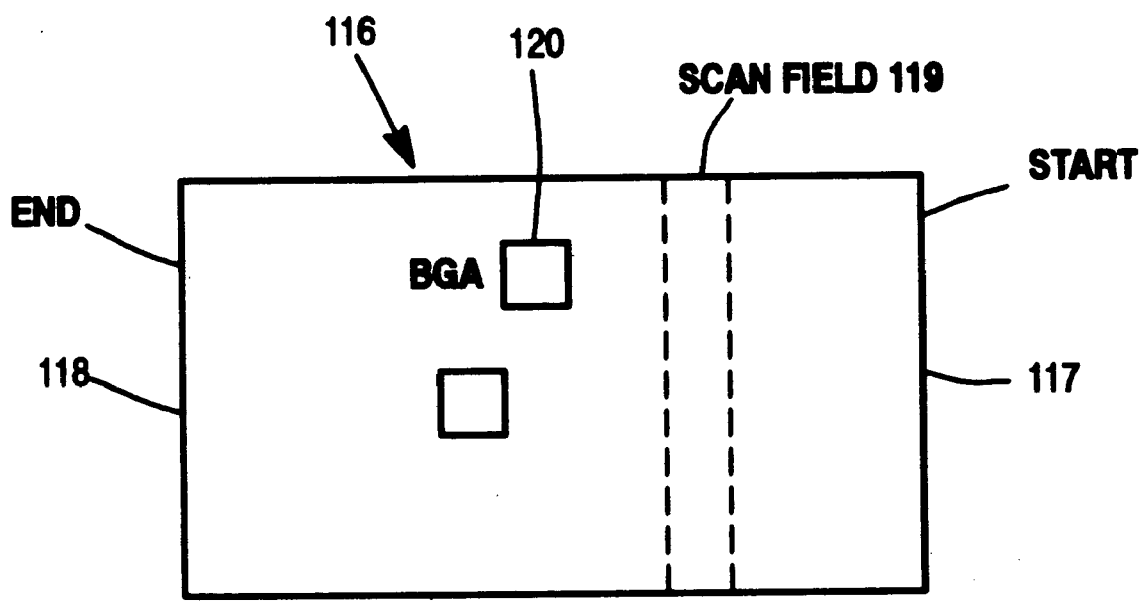
FIG. 10 is a schematic drawing showing a preferred scan or partial frame grab of a portion of a moving substrate.

Refer now to FIG. 10 showing a schematic drawing of a preferred scan or a partial frame grab of a portion of a moving substrate 116. The substrate when it passes through the oven 10 on the belt 21 passes under a scanner which can sense the leading edge 117 as well the trailing edge 118 and is capable of scanning completely across a substrate 116 shown by the scan field 119. A plurality of such scan fields are obtained by each of the sensors S1 through S5 at the scanner positions S1 through S5 shown on FIGS. 5 and 6. With reference to FIG. 7, it is now possible to generate feedback signals which control the fan motor 22, control the fan speeds of the fans F so as to effect changes in temperature ΔT as well as to effect the power which is supplied to the individual heaters 59 so as to further control and stabilize the convection air temperature at a desired and optimum level. Belt speed is controlled so as to effect an exact and desirable solder paste temperature profile of the type which results in perfect solder joints between the multiple components being solder connected to a substrate 116.

Having explained a preferred embodiment of the present invention, it will now be appreciated that the present invention does not require a complete remanufactured reflow oven, but may be effected by separating the heaters 11 through 20 from each other so as to obtain infra red scans or frame grabs of the substrate that are passing along the belt in the aforementioned zones of a reflow oven so as to obtain solder paste temperatures which were not obtainable heretobefore. This is to say that in the prior art the solder paste temperature was a theoretical figure which was presumed to fall between the set point profiles generally shown in FIG. 3 and hopefully embraced the solder paste temperature curve. It is now possible to generate a solder paste temperature curve. Even though some of the points to be soldered may be under a surface-mounted component and cannot be seen directly by an infra red camera, if the surrounding conditions of the solder are obtainable and the preflow curve is completely stabilized, it is known that the ramp up temperature which occurs in the reflow zone can be observed for those points which are visible to the infra red camera and calculations can be made which accurately predict the solder paste reflow temperature of the solder underneath a surface-mounted component.

One of the features of the present invention permits an operator to generate a solder paste time and temperature profile curve which may be defined by digital data and the central controller, and that data may be transferred to any oven, so that control conditions of the different oven are manipulated to obtain the identical solder paste temperature curve. Using automatic feedback control signals of the type described, that were not available heretobefore in the prior art reflow ovens, the actual solder paste time/temperature profile curves may be read in real time production, may be stored for later use, and may be used to emulate a solder paste time/temperature programmed into a reflow oven.

Having explained a preferred embodiment feedback system with a sensor following each zone that may be separately controlled, it is apparent that the feedback system is operable with fewer sensors than those shown. When the solder paste temperature is sensed at one or two points on the solder paste curve it is possible to calculate and/or accurately predict temperature at other points on the curve. However, it is preferred that at least two points at or on the reflow portion of the curve are available to the controller so that reflow time and temperature may be calculated and controlled in real time as explained herein. While the preferred embodiment is shown and explained as a modification of an existing reflow oven, the sensors or sensing points may be placed inside of a redesigned oven.

What is claimed is:

1. Apparatus for controlling solder reflow time and temperature of a component populated substrate, comprising:
    a multi-zone reflow oven having a substrate carrier belt, heating elements means and convection fans,
    belt drive means for controlling the carrier belt speed,
    fan drive means for controlling the convection air flow,
    power means for controlling the temperature of said heating element means,
    said reflow oven having a central controller capable of effecting control of said belt drive means, said fan drive means, and said power means,
    keyboard means coupled to said central controller for setting initial control parameters in said central controller and for creating a desired solder paste temperature profile and deviation set points in each of the zones of said multi-zone reflow oven,
    thermal scanner means coupled to said central controller for thermally scanning a substrate moving through said reflow oven,
    said thermal scanner means comprising an infra red optical device for generating an infra red thermal map of a view of said substrate,
    said central controller having means for determining the actual solder paste temperature at points on said solder paste temperature profile, by analysis of said infra red thermal map, and
    program control means in said central controller for generating feedback control signals for changing one or more of said belt drive means, said fan drive means and/or said power means to effect a desired solder paste temperature at said points scanned by said thermal scanner.

2. Apparatus as set forth in claim 1, wherein said thermal scanner means comprises an infra red charged coupled device (CCD) mounted outside of said reflow oven, and
    optical lens means for obtaining said view of said substrate in a closed reflow oven and projecting a substrate image onto said CCD.

3. Apparatus as set forth in claim 2 wherein said thermal scanner means comprises a plurality of CCDs.

4. Apparatus as set forth in claim 3 wherein said thermal scanner comprises a plurality of CCD cameras.

5. Apparatus as set forth in claim 3 wherein said thermal scanner means comprises a plurality of CCD infra red arrays.

6. Apparatus as set forth in claim 1 wherein said central controller further comprises memory means for storing said desirable solder paste temperatures that have been previously calibrated.

7. Apparatus as set forth in claim 6 wherein said program means comprises means for determining the actual solder paste temperature at different components at the same point on said solder paste temperature profile.

8. Apparatus as set forth in claim 6 herein said program means further comprise means for sensing and for recording in said memory means actual solder paste temperatures at different components.

9. Apparatus as set forth in claim 1 wherein said infra red sensor means is coupled to said feedback controller means for generating an infra red thermal map at a reflow portion of an actual solder paste curve.

10. Apparatus as set forth in claim 9 wherein said infra red sensor means comprises a sensor mounted on said reflow oven to scan said component populated boards at the end of the reflow zone of said multi-zone reflow oven.

11. Apparatus as set forth in claim 9 wherein said infra red sensor means comprised at least two sensors mounted on said reflow oven for sensing separated points on said solder paste curve at or in the reflow zone of said multi-zone reflow oven.

12. Apparatus as set forth in claim 1 wherein said solder paste curve comprises a reflow portion and said reflow oven comprises a reflow zone,
    said infra red sensor means comprises at least two sensors for generating thermal maps at different points on said reflow portion of said solder paste curve, and
    said feedback control means comprises means for determining the time that the solder paste remains in a molten state in said reflow zone.

13. A reflow oven of the type employed to control heating of a component populated board according to a theoretical solder paste curve wherein said reflow oven is provided with a plurality of heat zones surrounding portions of a conveyor belt, characterized in that each heat zone has convection fan means and/or radiant block heating means which are individually adjustable, infra red sensor means for sensing the temperature of solder paste and the components on a board as they pass in front of said sensor means, feedback controller means coupled to said infra red sensor means for comparing sensed solder paste temperatures with stored predetermined desirable solder paste temperatures, and program means in said feedback controller means adapted to control said conveyor belt speed, said fan means speed and the power to said block heating means to maintain said theoretical solder paste curve.

14. A reflow oven as set forth in claim 13 wherein said feedback controller means comprises a computer having memory means for storing solder paste temperatures.

15. A reflow oven as set forth in claim 14 wherein said infra red sensor means comprises means for scanning a board and said feedback controller means comprises means for producing an infra red pixel map of a board which is stored in said memory means.

16. A reflow oven as set forth in claim 15 wherein said program means comprises means for converting predetermined pixel areas of said infra red pixel map to temperatures.

17. A reflow oven as set forth in claim 15 wherein said program means comprises means for converting predetermined pixel areas of said infra red pixel map to solder paste temperatures.

18. A reflow oven as set forth in claim 15 wherein said program means comprises means for determining the temperature of components on said board and the solder paste temperature associated with said components.

19. A reflow oven as set forth in claim 18 wherein said controller means comprises means for determining said associated solder paste temperatures from pixel areas of said infra red map and conversion data stored in said program means.

\* \* \* \* \*